United States Patent
Rosenthal et al.

[11] Patent Number: 5,347,887
[45] Date of Patent: Sep. 20, 1994

[54] COMPOSITE CUTTING EDGE

[75] Inventors: Richard D. Rosenthal, Boulder; Gerald L. DePoorter, Superior, both of Colo.; Ronald I. Christy, Malibu, Calif.

[73] Assignee: Microsurgical Techniques, Inc., Fort Collins, Colo.

[21] Appl. No.: 31,230

[22] Filed: Mar. 11, 1993

[51] Int. Cl.⁵ ............................................. B26B 21/54
[52] U.S. Cl. ................................. 76/104.1; 76/DIG. 8
[58] Field of Search ............. 76/101.1, 104.1, DIG. 8; 30/346.54, 346.53, 346

[56] References Cited

U.S. PATENT DOCUMENTS

| | | | |
|---|---|---|---|
| 3,894,337 | 7/1975 | Jones | 30/346.54 |
| 3,900,636 | 8/1975 | Curry et al. | 427/38 |
| 3,915,757 | 10/1975 | Engel | 148/6 |
| 5,048,191 | 9/1991 | Hahn | 30/346.54 |
| 5,056,227 | 10/1991 | Kramer | 30/346.54 |
| 5,121,660 | 6/1992 | Kramer | 76/104.1 |

FOREIGN PATENT DOCUMENTS

| | | | |
|---|---|---|---|
| 1544129 | 4/1979 | United Kingdom | 76/104.1 |
| 1544130 | 4/1979 | United Kingdom | 76/104.1 |

*Primary Examiner*—Roscoe V. Parker
*Attorney, Agent, or Firm*—Sheridan Ross & McIntosh

[57] ABSTRACT

A process for shaping a blade edge and coating the blade edge to improve the properties thereof is provided. The process includes an ion etching step using a collimated beam to reduce microcracks and an ion assisted processing step wherein ions are used to enhance the properties of a coating. The blade can then be sharpened again. The blade can be made from materials such as metal, ceramic of glass-ceramic.

29 Claims, 3 Drawing Sheets

COMPOSITE CUTTING EDGE

BACKGROUND OF THE INVENTION

1. Field of the Invention

The present invention relates to the manufacture of composite cutting edges. More particularly, the present invention relates to the manufacture of cutting edges using ion etching and ion assisted processes.

2. Description of Related Art

Depending upon the application of a cutting implement, one or more factors may be important to the usefulness the cutting blade used in the implement. These factors can include the strength, toughness, sharpness, hardness, friction and corrosion resistance of the blade. Some prior art references have disclosed methods for producing blades that address some of these problems.

Use of a sputter etching technique to shape a blade edge has been described, for example in U.S. Pat. No. 5,056,227 by Kramer and U.S. Pat. No. 5,048,191 by Hahn. In the Kramer patent, a razor blade is formed by grinding a ceramic substrate with diamond abrasive and smoothing and honing the edge with diamond grit. To sputter the edge, the sputtering chamber is evacuated to a pressure equal to or better than $2 \times 10^{-6}$ torr and argon is introduced to attain a sputtering gas pressure of 10 millitorr. 13.56 megahertz RF power is applied to establish a stable plasma with 200° C. watts RF forward power. Using an argon plasma sheath that comes in from all directions, an etch duration of 2.5 minutes reduces the tip radius to about 200 Angstroms. Thereafter, the sputtering unit can be switched from etch mode to deposition mode and a chromium-platinum coating can be sputtered onto the edge by pre-sputtering a chromium-platinum target and depositing the released atoms on the blade edges. The Hahn patent discloses a similar process for use with single crystal substrates.

Other patents have suggested the use of implantation to modify the properties of the cutting edge. For example, U.S. Pat. No. 3,900,636 by Curry et al. discloses that the properties of a cutting edge, such as the hardness, can be improved by subjecting the edge to an ion implantation treatment. Curry et al. disclose a process for treating steel cutting edges by ion implantation using ions that either form compounds with the steel, such as H, B, C or N, or those that do not form compounds, such as Ti or Cr. The patent also discloses that inert ions can be implanted to increase the adhesion of the coatings. The ions impinge directly on the blade surface with an ion beam energy of between about 10 keV and 400 keV.

U.S. Pat. No. 3,915,757 by Engel discloses a process for forming an edge from a steel or iron containing substrate by implanting metal ions, such as titanium, zirconium, or the like, into the blade edge and hardening the edge by nitriding or carburizing the implanted ions. The blade is placed in an ion chamber and is cleaned with an argon plasma. A pool of molten metal is heated, the metal vaporizes and forms ions which are attracted to the blades since the blades function as the cathode. The first ions that strike the substrate are implanted until the surface becomes saturated, at which point the metal ions. plate the surface. The plating can then be carburized or nitrided to form a hardenable surface.

U.S. Pat. No. 3,894,337 by Jones discloses a method for making razor blades from a single crystal of alumina. The edge of the single crystal alumina can be shaped by bombardment with inert ions. It is disclosed that a substantially flat beam or a substantially cylindrical or conical beam can be used. In the case of cylindrical or conical beams, the beam of ions may be oscillated to form a wide beam. Thereafter, larger ions can be "stuffed" into the edge of the blade to increase the strength thereof. The large ions can be introduced into the single crystal alumina by ion implantation methods using beams of high energy ions, such as ions having an energy of about $10^3$ eV. Optionally, the razor blades may be coated, for example with chromium or nitrided metals or nittided alloys.

SUMMARY OF THE INVENTION

The present invention is directed to a process for making a blade that includes the steps of providing a blade blank having a sharpened edge, ion etching the edge with a collimated beam of ions and depositing a coating on tje edge using an ion assisted process.

In one embodiment, the ion assisted process includes depositing a metallic material on the edge by ion assisted physical vapor deposition to form a first coated layer on the edge. The depositing step can also include the step of forming a metal compound on the first coated layer using an ion assisted chemical reaction process to form a second coated layer. The physical vapor deposition can also implant ions into the edge to illcrease the fracture toughness of the edge.

In one embodiment, the blade blank is made from a ceramic material. In another embodiment, the substrate is made from a metal. In yet another embodiment, the blade blank is made from a glass-ceramic material.

The blade produced according to the present invention has a high degree of hardness and toughness, is resistant to corrosion and includes composite layers that are well adhered. The blade can be particularly useful in surgical instruments such as orthopedic saws, laparoscopic instruments, neurological instruments and opthamalic instruments.

DETAILED DESCRIPTION

The process for forming a cutting blade according to the present invention begins with a blade blank that has at least one sharpened edge formed thereon. The blade blank can be fabricated from any of a number of materials that include metals, ceramics, glasses and glass-ceramics. Ceramics and glass-ceramics can be advantageous since that offer some advantages over metals, such as increased hardness and corrosion resistance. In one embodiment according to the present invention, the blade blank is formed from a glass-ceramic material, for example a glass-ceramic enstatite chain-based material.

Preferably, the glass-ceramic has a grain size of from about 5 microns to about 8 microns. In yet another embodiment, the blade blank is a composite comprising a metal core with a layer of ceramic surrounding the metal core.

According to one embodiment of the present invention, the blade blank can be formed by mechanically abrading a substrate to form a sharpened edge thereon. For example, the substrate can be an individual sheet of the desired material that is about 1 inch by 2 inch by 0.025 inch thick. According to this embodiment, a plurality of the substrates can be mounted onto a blocking tool which is designed to hold the substrates as they are ground and polished to form a sharpened edge on each substrate. For example, the blocking tool can be an eight inch diameter disc that has several 10° wedges machined into the block surface. The surface of the blocking tool is preferably waxed such that the wax functions as an adhesive for holding the substrates in the wedges during the edge forming process. The blocking tool with the substrates placed thereon is preferably milled to form a substantially flat surface on the tool's side support pieces before the substrates are machined.

After milling the blocking tool, the substrates are preferably lapped on a spindle polisher with loose abrasives. For example, a slurry of diamond paste having an average diameter of about nine microns can be used for the first bevel cut. Thereafter, a second bevel cut can be made using a slurry of five micron diamond paste. Then, diamond polish powder having a size down to about 0.1 micron can be used on a felt pad to smooth the sharpened edge. The substrates are then removed, turned over and rewaxed in the support to repeat the same process in order to form a wedge shaped sharpened edge. When this process is completed, the blade blanks can be cut, for example on a diamond saw blade, to achieve the desired blade width. Other features, such as notches for the purpose of holding the blade in a blade handle, can also be machined into the blade.

Figures 1, 2A, 2B:
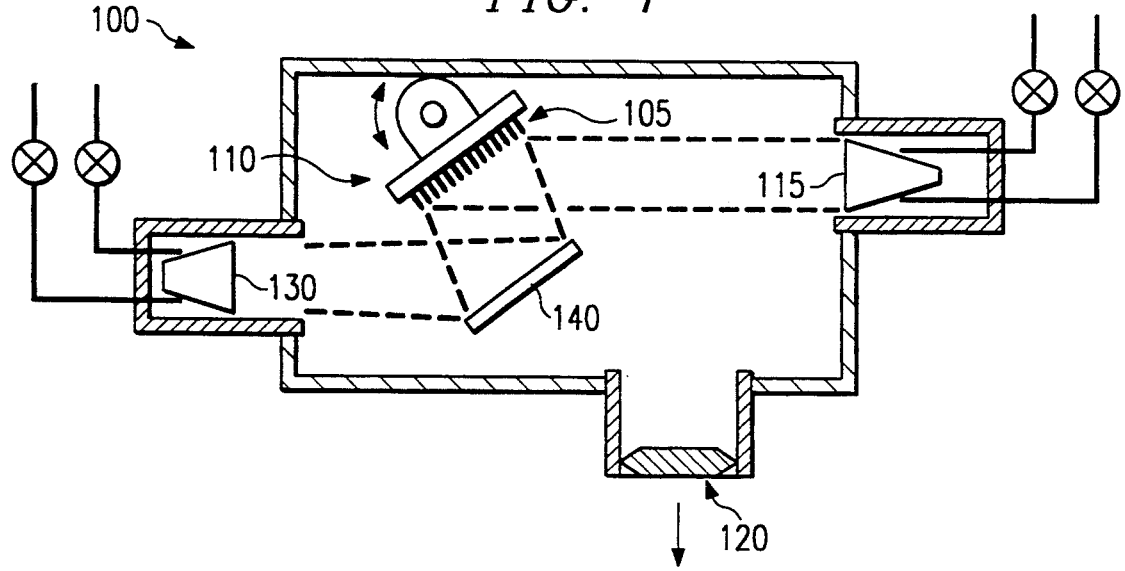
FIG. 1 illustrates an apparatus useful for carrying out the process of the present invention.
FIGS. 2a and 2b illustrates ions striking the surface of a blade edge according to the present invention and according to a prior art method.

According to the present invention, the blade blank is subjected to a sequence of edge shaping and modifying steps to enhance the properties of the edge, such as the strength, hardness, toughness, corrosion resistance and friction. An apparatus useful for shaping and modifying the sharpened edges of a plurality of blade blanks is illustrated in FIG. 1. Referring to FIG. 1, a plurality of blade blanks 105 are mounted on a table 110. The table 110 is preferably rotatable so that the incident angle of a collimated beam of ions from a first ion source 115 impinging on the blade blanks 105 can be altered if desired. The ion source 115 is preferably a Kauffman ion source.

According to the present invention, the sharpened edges on the blade blanks 105 are further sharpened and are smoothed by a controlled ion etching step. During this step, the apparatus 100 is evacuated using a pump 120 to reduce the pressure in the apparatus 100. Preferably, the pressure is reduced to less than about $5 \times 10^{-6}$ torr. The blade blanks 105 are positioned on the table 110 at a distance of about 50 centimeters from the first ion source 115. A collimated beam of, for example, argon ions from the first ion source 115 is directed at the edges of blade blanks 105. As used herein, the term collimated beam refers to a beam of ions having a maximum angular deviation from center-line of 2° or less. That is, in the distance from the ion source 115 to the blade blanks 105, substantially no ions should deviate by more than about 2° from a parallel to the central axis of the beam.

Preferably, the incident angle of the collimated beam on the blade edges is from about 10° to about 20°. Referring to FIG. 2, FIG. 2(a) illustrates an argon beam arriving at the surface of a blade surface according to the present invention. The optimum angle $\theta$ can be experimentally determined for a given material and in one embodiment is from about 10° to about 20°. It is important that this angle be maintained to maximize the ion etch rate and optimize the shape of the blade edge. Because the sputter etch removal rate is at a minimum for ions that are directed perpendicular to the surface being ion etched, and increases as the angle of incidence decreases, a collimated beam of ions directed at the point of the edge of a blade, as shown in FIG. 2(a), will effectively sharpen the blade. A non-collimated ion etch, such as that obtained by an RF plasma and shown in FIG. 2(b), will be less effective sharpening the edge of the blade.

The inert ions preferably arrive at the surface of the edge with from about 1,000 to about 3,500 electron volts (1 keV to 3.5 keV) of energy to enhance the sharpening of the blade edge. Both the specific ion energy and the total flux of the collimated beam of ions can be experimentally determined to provide a maximum ion etch rate without substantial heat distortion to the cutting edge for a particular material. For example, when etching a glass-ceramic material in this manner, the ion energy is preferably from about 1 keV to about 3 keV and the ion flux is preferably about 0.1 milliamp per square centimeter (mA/cm$^2$). The blade blanks are preferably ion etched the collimated beam of ions for from about 1 to about 20 minutes. However, the etch duration will depend on the material being etched. For example, a ceramic material may require etching for 10 to 30 times longer than a metallic material.

Figure 3A:
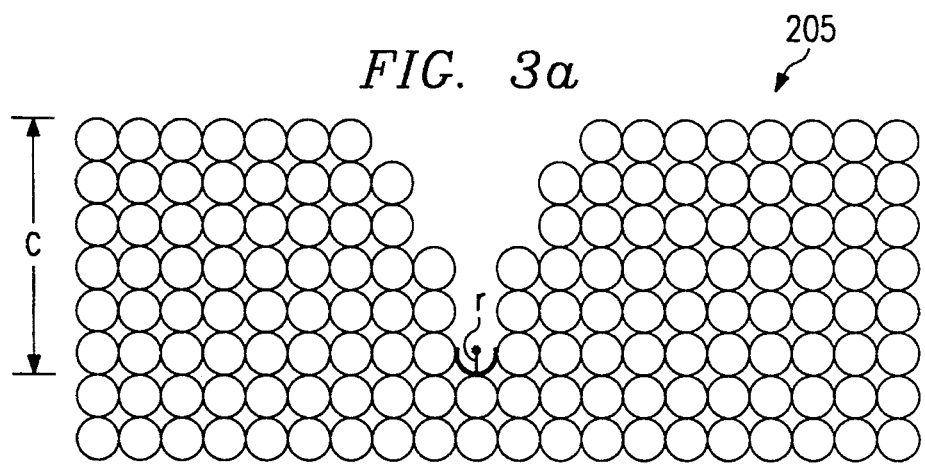
FIGS. 3a and 3b illustrate a microcrack on the surface of a blade edge.
Figure 3B:
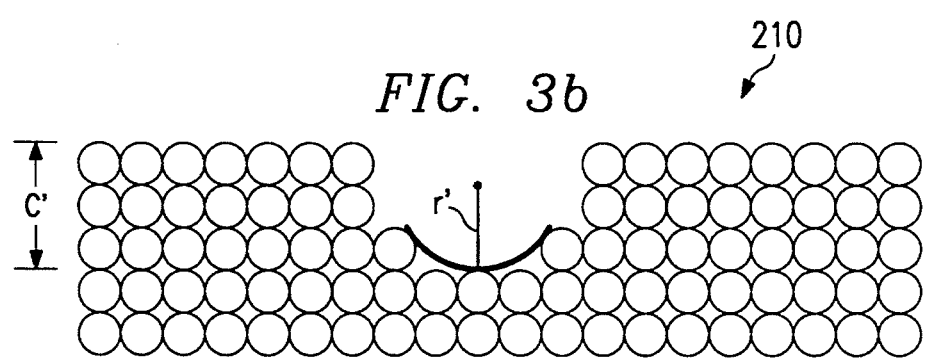

The ion etching step will smooth, sharpen and toughen the blade blank. FIG. 3 illustrates the microscopic effect of ion etching according to the present invention on the surface 205 of the blade blank edges. The surface 205 will inherently include a number of defects such as the microcrack illustrated in FIG. 3. Such microscopic defects are inherent in most materials, particularly when the substrate is mechanically abraded to form the edge. For non-ductile materials such as ceramic, glass or glass-ceramic, the presence of such a defect limits the maximum strength of the blade since the concentration of stress at the tip of the microcrack will be higher than the macroscopic stress applied to the object. The relationship is illustrated by the Inglis equation:

$$\sigma_m = 2\sigma_a \left(\frac{c}{r}\right)^{\frac{1}{2}}$$

wherein
$\sigma_m$ is the maximum stress at the crack tip;
$\sigma_a$ is the applied stress;
c is the length of the axis of the crack; and
r is the radius of the crack tip.

As illustrated in FIG. 3, the ion etching process according to the present invention will reduce the length (c') of the major axis of the crack, increase the radius (r') of the crack tip and expose a new surface 210. The net effect according to the Inglis equation is to reduce the maximum stress ($\sigma_m$) that occurs at the crack tip thereby strengthening and toughening the material.

According to the present invention, the ion etching step is carried out at a sufficient ion energy and sufficient time to significantly reduce or eliminate a majority of the defects on the blade edge. In a preferred embodiment, substantially all of the defects on the blade edge are eliminated by the ion etching process.

After smoothing and sharpening the edge, a coating is deposited on the blade edge using ion assisted process steps. As used herein, the term ion assisted process step refers to a process step wherein inert, or inactive, ions collide with an ion or atom of interest (the active species) to enhance the properties of the deposited layer. For example, one ion assisted process step is referred to herein as "ion assisted physical vapor deposition." This is a process step in which the adhesion and structure of a sputtered coating is enhanced by collisions of the active species being sputtered with inert ions, prior to reaching the surface being coated.

Another ion assisted process step used herein referred to as "ion assisted chemical reaction." In this process step, a sputtered atom is caused to undergo a chemical reaction before and during its contact with the deposition surface by a collision with a reactive partner. Examples of these process steps are explained in more detail hereinbelow.

An ion assisted physical vapor deposition step can be understood by reference to FIG. 1. During this step, a second ion source 130 is directed at a target 140. The target is fabricated from the metallic material to be deposited on the blade edge. The metal is preferably a corrosion resistant metal, such as platinum or titanium. The target 140 can also be water cooled. Ions from the ion source 130 are directed at the target 140 with a beam energy of at least about 1 keV and a flux of about 0.1 mA/cm$^2$. The ions striking the target will release metal ions from the target, and these ions will migrate toward the edges of the blade blanks. The second ion source continues to direct an ion beam at the metal target, preferably for from about 1 to about 10 minutes.

When the metal ions are in the vicinity of the blade blanks 105 the first ion source 115 is activated to direct inert ions, such as argon ions, at the blade blanks 105. The argon ions from the first ion source preferably have an energy of at least about 1 keV and a flux of about 0.1 mA/cm$^2$. The ion flux from the ion source 115 is continued to assist in the deposition of the target ions on the blade edge. The attachment of the target ions to the surface the blade edge is advantageously enhanced by two factors. First, metal ions on the surface of the edge will be impacted by ions impinging on the surface and will effectively be driven into the surface because of the energy transferred to them from the inert ion beam. Second, gas phase collisions between the metal ions and the ions from the ion source will increase the velocity of the metal ions and thus increase the effective force between the metal ions and the blade surface.

Figure 4A:
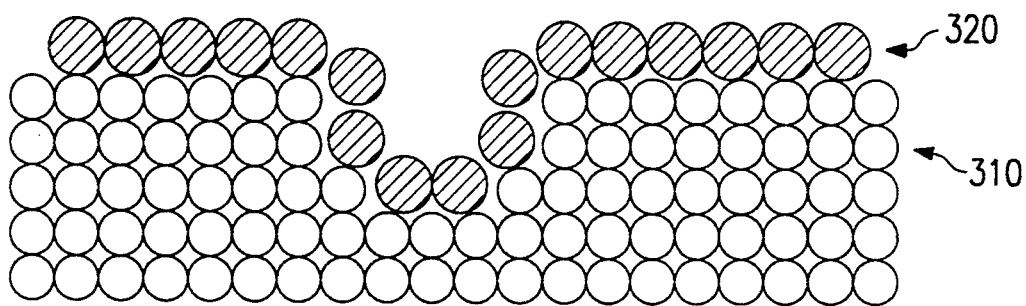
FIGS. 4a–4c illustrate a microscopic view of coatings. on a blade surface produced according to certain embodiments of the present invention.

This process step is capable of producing a dense, well adhered and very thin metal layer that substantially fills any surface defects that may remain after the ion etch step. Preferably, the layer has a thickness of from about 50 Angstroms to about 5,000 Angstroms. The metal layer can also advantageously prevent additional surface flaws from forming on the surface. FIG. 4a illustrates the surface of a blade edge 310 after it has been coated by an ion-assisted physical vapor deposition step. The metal coating 320 is smooth, thin and well adhered to the surface 310.

Figure 5:
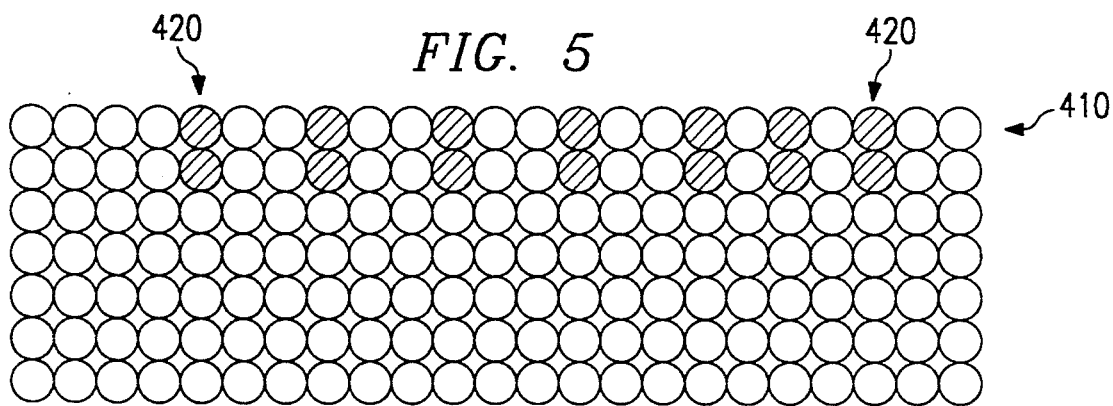
FIG. 5 illustrates the surface of a blade produced according to one embodiment of the present invention.

In addition to coating the surface of the blade edge, it may be worthwhile to implant ions into the surface using an ion assisted physical vapor deposition process step. In this embodiment, it is preferable to implant ions into the surface of the blade edge that are larger than the atoms that constitute the blade edge material. By forcing larger ions into the surface, the surface is placed into a state of compression that must be overcome by applied tensile force before the edge can break. This is illustrated in FIG. 5, which shows the surface of an edge 410 implanted with foreign atoms 420. To implant an effective number of large ions, the ion beam energy should be at least about 3 keV.

Ion implantation is effective for increasing the strength and toughness of the supporting facets of the blade. However, it is not believed that the tip of the cutting edge can be put into a compressive state due to the thinness of the material at the edge tip. According to the present invention, the strength and toughness of the tip is increased by the removal of surface flaws during the ion etch, followed by the sealing of the surface with a metal layer that prevents formation of new surface flaws.

After the ion assisted physical vapor deposition step, an ion assisted chemical reaction step can be used to provide a second surface coating of a metal compound. Referring back to FIG. 1, the ion beams from the ion sources 115 and 130 are continued. The ion beam energy from second ion source 130 is preferably about 1 keV and the ion flux is about 0.1 mA/cm$^2$ during this step. The metal target material may be changed or it may be the same material used during the previous step. The type of chemical process that can occur in this step is best described by the following example.

Titanium is one of several metals that can be implanted and then overcoated on surfaces by ion assisted physical vapor deposition. During the deposition of a titanium metal layer on the surface, nitrogen (N$_2$) can be introduced into the chamber or nitrogen ions can be introduced into the chamber by an ion beam from the first ion source 115. When nitrogen is introduced using the first ion source 115, an ion beam energy of about 1 keV and a flux of about 0.1 mA/cm$^2$ is preferably used.

The nitrogen atoms or ions react with the titanium on the surface of the blade edge to form a surface layer of titanium nitride (TIN). Additional titanium can be generated by continuing to direct the second ion source 130 at the target 140. Preferably, the metal compound surface layer has a thickness of from about 0.5 micrometer to about 3 micrometers. Other metal compounds, such as ZrB$_2$, can be deposited by a similar method.

Figure 4B:
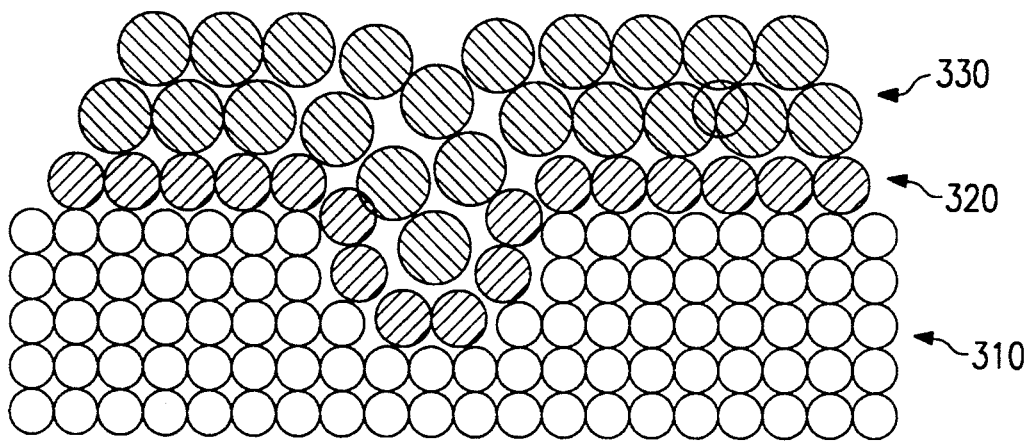
Figure 4C:
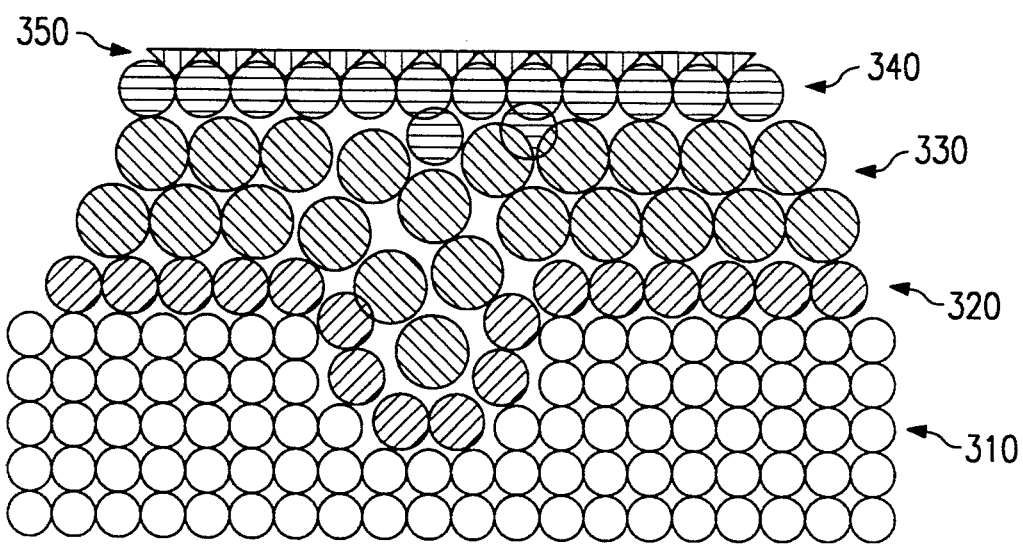

FIG. 4b illustrates the surface of a blade edge 310 that has been coated with a metal layer 320 as described hereinabove. A metal compound layer 330 is adhered to the metal layer 320 by an ion assisted chemical reaction step.

The metal compound layer can be particularly advantageous when the blade is used in applications such as medical applications that require autoclaving of the blade, since the metal compound can protect the blade from deterioration by hot steam. Further, the metal compound layer can have a lower coefficient of friction that the base layer, which assists in cutting efficiency. In addition, the metal compound layer can protect the base material from having stabilizing components leached out if the material were, for example, a transformation-toughened zirconia.

After deposition of the second coated layer, the blade can be resharpened using the ion etch as described previously. Alternatively, a third metal layer 340 may be deposited on the surface as illustrated in FIG. 3c. The third metal layer can be deposited in a manner similar to that described for the metal layer 320. A third metal layer may be advantageous in surgical applications since any piece left in an incision will be x-ray opaque and can be detected and removed.

Additionally, a final layer of material 350 can be deposited on the surface of the blade depending on the intended end use of the cutting instrument. For example, thin films of metallic or ceramic compounds can be deposited or hard diamond-like carbon coatings can be applied. Further, fluoropolymer filled silica can be applied to the blade edge to enhance the cleaning properties of the blade when the blade is used in surgical applications. Such a coating can reduce the amount of material, such as proteins, that otherwise adheres to the cutting instrument.

Blades produced according to the present invention can advantageously provide increased strength, hardness, toughness and corrosion resistance. For example, blades produced according to the present invention can have an edge strength of three times the edge strength of nontreated blades.

The blades produced according to the present inventiota, can be used in a wide variety of applications, from basic cutting tools to surgical instruments. The blades can have particular use in surgical applications, especially where tactile sense is not particularly important. Such applications can include orthopedic (bone) saws, laparoscopic instruments, neurological instruments, opthamalic instruments and other remotely controlled cutting instruments.

While various embodiments of the present invention have been described in detail, it is apparent that modifications and adaptations of those embodiments will occur to those skilled in the art. However, it is to be expressly understood that such modifications and adaptations are within the spirit and scope of the present invention.

What is claimed is:

1. A process for making a blade, comprising the steps of:
    (a) providing a blade blank having a sharpened edge;
    (b) ion etching said edge with a collimated ion beam to sharpen said edge and to remove material therefrom, wherein the crack lengths of a majority of microcracks on said edge are reduced and the crack tip radii of a majority of microcracks on said edge are increased thereby toughening and strengthening said edge; and
    (c) depositing a coating on said edge using an ion assisted process.

2. A process as recited in claim 1, wherein said depositing step comprises the step of depositing a metallic material on said edge by ion assisted physical vapor deposition to form a first coated layer on said edge.

3. A process as recited in claim 2, wherein said depositing step further comprises the step of forming a metal compound on said first coated layer using an ion assisted chemical reaction process to form a second coated layer.

4. A process as recited in claim 1, wherein said depositing step includes implanting ions into said edge to increase the fracture toughness of said edge.

5. A process as recited in claim 1, wherein said blade blank comprises a ceramic material.

6. A process as recited in claim 1, wherein said blade blank comprises a metallic material.

7. A process as recited in claim 1, wherein said blade blank comprises a glass-ceramic material.

8. A process as recited in claim 1, wherein said blade blank comprises a metal core surrounded by a ceramic layer.

9. A process as recited in claim 2, wherein said metallic material comprises titanium.

10. A process as recited in claim 3, wherein said metal compound comprises titanium nitride.

11. A process as recited in claim 1, wherein said providing step comprises the step of mechanically abrading a substrate.

12. A process as recited in claim 11, wherein said abrading step comprises the steps of grinding and polishing said substrate with diamond grit.

13. A process as recited in claim 12, wherein said grinding and polishing step comprises the step of polishing said substrate with submicron diamond powder.

14. A process as recited in claim 1, wherein said ion etching step comprises the step of directing a collimated ion beam at said edge having a beam energy of from about 1 keV to about 3.5 keV.

15. A process as recited in claim 14, wherein the etching rate is adjusted by tilting said edge at an angle relative to the direction of said ion beam.

16. A process as recited in claim 15, wherein the incident angle of the ion beam on the blade edge is from about 10° to about 20°.

17. A process as recited in claim 14, wherein said ion beam is an argon beam.

18. A process as recited in claim 2, wherein said first coated layer has a thickness of from about 50 Angstroms to about 5000 Angstroms.

19. A process as recited in claim 3, wherein said second coated layer has a thickness of from about 0.5 micrometers to about 3 micrometers.

20. A process as recited in claim 3, further comprising the step of:
    (d) ion etching said second coated layer to sharpen said edge.

21. A process as recited in claim 3, further comprising the step of:
    (d) coating said second coated layer with a third coated layer comprising a metallic material.

22. A process as recited in claim 21, further comprising the step of depositing a diamond-like carbon layer on said third coated layer.

23. A process as recited in claim 21, further comprising the step of depositing a fluoropolymer filled silica coating on said third coated layer.

24. A process as recited in claim 1, wherein said blade is used in a cutting tool.

25. A process as recited in claim 1, wherein said blade is used in a surgical scalpel.

26. A process as recited in claim 1, wherein said blade is used in an orthopedic saw.

27. A process as recited in claim 1, wherein said blade is used in a laparoscopic instrument.

28. A process as recited in claim 1, wherein said blade is used in a neurological instrument.

29. A process as recited in claim 1, wherein said blade is used in an opthamalic instrument.

* * * * *